United States Patent
Butler et al.

(10) Patent No.: US 9,122,173 B2
(45) Date of Patent: **\*Sep. 1, 2015**

(54) POSITIONING SYSTEM, LITHOGRAPHIC APPARATUS AND DEVICE MANUFACTURING METHOD

(75) Inventors: Hans Butler, Best (NL); Martinus Agnes Willem Cuijpers, Veldhoven (NL); Christiaan Alexander Hoogendam, Westerhoven (NL); Robertus Johannes Marinus De Jongh, Eindhoven (NL); Michael Jozef Mathijs Renkens, Sittard (NL); Marc Wilhelmus Maria Van Der Wijst, Veldhoven (NL); Maurice Willem Jozef Etiënne Wijckmans, Eindhoven (NL); Robertus Leonardus Tousain, Eindhoven (NL); Ronald Petrus Hendricus Faassen, Oss (NL); Adrianus Hendrik Koevoets, Mierlo (NL)

(73) Assignee: ASML Netherlands B.V., Veldhoven (NL)

( \* ) Notice: Subject to any disclaimer, the term of this patent is extended or adjusted under 35 U.S.C. 154(b) by 664 days.

This patent is subject to a terminal disclaimer.

(21) Appl. No.: 13/398,890

(22) Filed: Feb. 17, 2012

(65) Prior Publication Data

US 2012/0147355 A1 Jun. 14, 2012

Related U.S. Application Data

(63) Continuation of application No. 12/409,919, filed on Mar. 24, 2009, now Pat. No. 8,144,310.

(60) Provisional application No. 61/071,126, filed on Apr. 14, 2008.

(51) Int. Cl.
  *G03B 27/58* (2006.01)
  *G03B 27/42* (2006.01)
  *G03F 7/20* (2006.01)

(52) U.S. Cl.
  CPC ............ *G03F 7/709* (2013.01); *G03F 7/70758* (2013.01); *G03F 7/70766* (2013.01)

(58) Field of Classification Search
  CPC .................. G03F 7/70758; G03F 7/70766
  USPC ............ 355/53, 72–77; 310/10, 12; 318/566, 318/568.11
  See application file for complete search history.

(56) References Cited

U.S. PATENT DOCUMENTS 6,028,376 A   2/2000 Osanai et al.
6,222,614 B1  4/2001 Ohtomo (Continued)

FOREIGN PATENT DOCUMENTS

DE   199 38 893 A1   3/2001
JP   10-223527 A    8/1998

(Continued)

OTHER PUBLICATIONS

European Search Report directed to related European Patent Application No. EP 09 003803, completed Jun. 15, 2009; 7 pages.

(Continued)

*Primary Examiner* — Hung Henry Nguyen
(74) *Attorney, Agent, or Firm* — Sterne, Kessler, Goldstein & Fox P.L.L.C.

(57) ABSTRACT

A positioning system to position a table within a base frame of a lithographic apparatus, the positioning system including first and second actuators and a controller. The first actuator exerting an actuation force on the table. The first actuator being connected to a balance mass constructed and arranged to absorb a reaction force of the first actuator. The controller and second actuator constructed and arranged to exert a compensation force and/or torque to compensate a torque caused by the actuation force exerted by the first actuator on the balance mass.

16 Claims, 4 Drawing Sheets

(56) References Cited

U.S. PATENT DOCUMENTS

| | | |
|---|---|---|
| 6,226,072 B1 | 5/2001 | Yabu |
| 6,414,742 B1 | 7/2002 | Korenaga et al. |
| 6,449,030 B1 | 9/2002 | Kwan |
| 7,110,086 B2 | 9/2006 | Loopstra et al. |
| 7,224,432 B2 | 5/2007 | Sasaki et al. |
| 7,248,339 B2 * | 7/2007 | Van Schothorst et al. ...... 355/72 |
| 7,292,317 B2 * | 11/2007 | Cox et al. .................. 355/72 |
| 7,417,711 B2 * | 8/2008 | Jacobs et al. ................ 355/53 |
| 7,738,080 B2 | 6/2010 | Itoh |
| 7,898,204 B2 | 3/2011 | Hunter |
| 8,144,310 B2 * | 3/2012 | Butler et al. ................ 355/72 |
| 2002/0021423 A1 | 2/2002 | Korenaga et al. |
| 2003/0202865 A1 | 10/2003 | Ponnekanti et al. |
| 2005/0099616 A1 | 5/2005 | Loopstra et al. |
| 2008/0166213 A1 | 7/2008 | Hunter |
| 2009/0262325 A1 | 10/2009 | Butler et al. |

FOREIGN PATENT DOCUMENTS

| | | |
|---|---|---|
| JP | 11-190786 A | 7/1999 |
| JP | 11-191526 A | 7/1999 |
| JP | 11-243132 A | 9/1999 |
| JP | 2001-217172 A | 8/2001 |
| JP | 2005-354022 A | 12/2005 |
| JP | 2007-273633 A | 10/2007 |

OTHER PUBLICATIONS

English-Language Translation of Notice of Reasons for Rejection directed to related Japanese Patent Application No. 2009-092537, mailed Aug. 2, 2011, from the Japanese Patent Office; 2 pages.

Notice of Allowance mailed Jan. 30, 2012 for U.S. Appl. No. 12/409,919, filed Mar. 24, 2009; 5 pages.

* cited by examiner

Fig 7

POSITIONING SYSTEM, LITHOGRAPHIC APPARATUS AND DEVICE MANUFACTURING METHOD

CROSS REFERENCE TO RELATED APPLICATIONS

This application is a continuation of U.S. application Ser. No. 12/409,919, filed Mar. 24, 2009, now U.S. Pat. No. 8,144,310, which is a Non Provisional of U.S. Application No. 61/071,126, filed Apr. 14, 2008, the content of which is incorporated herein in their entirety by reference.

BACKGROUND

1. Field of the Invention

The present invention relates to a positioning system, lithographic apparatus and method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In some systems, there is a positioning system used to position a table, which may be moveable using a planar motor. Reaction forces of the planar motor in the X, Y and Rz direction are transmitted to a balance mass. The balance mass is moveable over bearings that allow for movement of the balance mass in the X, Y and Rz direction with respect to a base plate, and does not allow movements, i.e., is stiffly coupled, in the Z, Rx and Ry directions with respect to the base plate. Reaction forces in all degrees of freedom of a fine positioning mechanism are exerted on the planar motor and transferred to the balance mass. The center of mass of the balance mass and the center of mass of an object table are at different positions in the Z-direction, the Z-direction being perpendicular to the X and Y directions. A consequence of the difference in center of mass is that when the planar motor exerts a horizontal force in the X and/or Y direction to the object table a torque around respectively the Y and/or X axes is generated in the balance mass. Because the balance mass is stiffly coupled to the base plate in the Rx and Ry directions through the bearings, this torque is transferred to the base plate. The torque may cause vibrations in the base plate, which deteriorates the functioning of the positioning system or a lithographic apparatus in which the positioning system may be used.

SUMMARY

It is desirable to provide a positioning system in which vibrations caused by a torque transferred from a balance mass to a base plate are minimized.

In an embodiment according to the present invention, there is provided a positioning system, having a first actuator, a controller, and a second actuator. The positioning system positions a support. The positioning system includes a first actuator configured to exert an actuation force on the support. The first actuator is coupled to a first balance mass constructed and arranged to absorb a reaction force resulting from the actuation force generated by the first actuator. The controller and the second actuator are constructed and arranged to exert a compensation force to compensate a torque caused by the actuation force exerted by the first actuator on the first balance mass.

In another embodiment of the present invention, there is provided a lithographic apparatus including an illumination system, a patterning device, a substrate support, a projection system, and a positioning system. The illumination system is configured to condition a radiation beam. The patterning device support is constructed to support a patterning device. The patterning device is capable of imparting the radiation beam with a pattern in its cross-section to form a patterned radiation beam. The substrate support constructed to hold a substrate. The projection system is configured to project the patterned radiation beam onto a target portion of the substrate. The positioning system is constructed and arranged to position at least one of the supports. The positioning system includes first and second actuators and a controller. The first actuator is configured to exert an actuation force on the support. The first actuator is coupled to a first balance mass constructed and arranged to absorb a reaction force resulting from the actuation force generated by the first actuator. The controller and the second actuator are constructed and arranged to exert a compensation force to compensate a torque caused by the actuation force exerted by the first actuator on the first balance mass.

In a further embodiment of the present invention, there is provided a device manufacturing method including the following steps. Providing a substrate that is at least partially covered by a layer of radiation-sensitive material on a substrate support. Providing a patterning device on a patterning device support. Projecting a patterned beam of radiation onto the layer of radiation sensitive material. Positioning at least one of the supports. The positioning includes exerting a first force between a first balance mass and the support. The first force moving the support relative to the first balance mass and controllably exerting a second force to compensate a torque caused by a difference in position of the center of mass of the first balance mass and the support.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
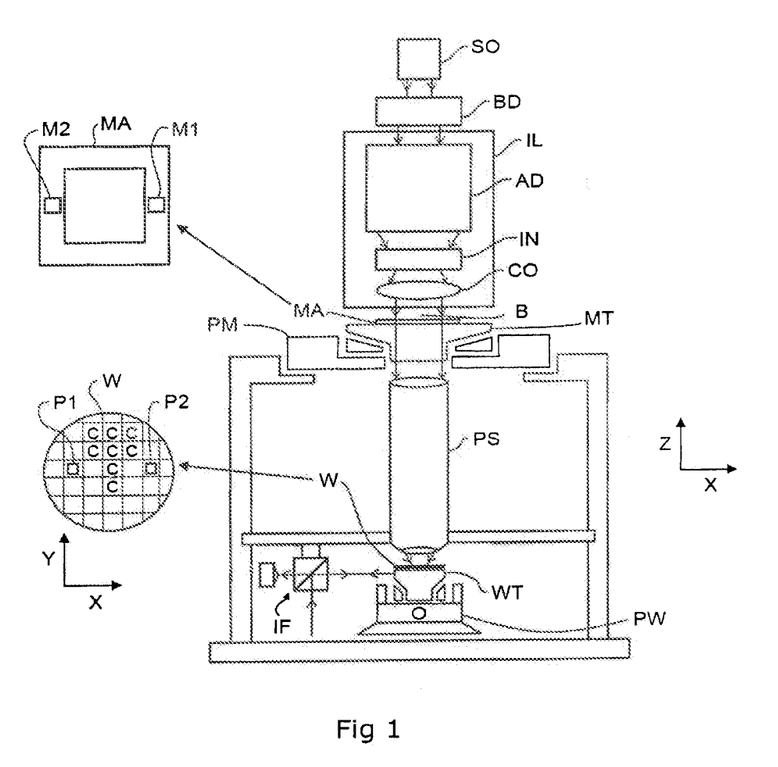
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a patterning device support or support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed. Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies.

The depicted apparatus could be used in at least one of the following modes:

1. In step mode, the patterning device support (e.g., mask table) MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the patterning device support (e.g., mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

The second positioning system PW, or the first positioning system PM, or both, includes: a first actuator configured to exert a force on the patterning device support (e.g., mask table) MT and/or the substrate support WT, the first actuator being connected to a first balance mass constructed and arranged to absorb reaction forces of the actuator, wherein the first balance mass and the support have a center of mass of which the position is different in a direction perpendicular to a movement direction and the positioning system includes a controller and a second actuator constructed and arranged to compensate a torque caused by the difference in position of the center of mass of the first balance mass and the patterning device support (e.g., mask table MT) and/or the substrate support WT.

Figure 2:
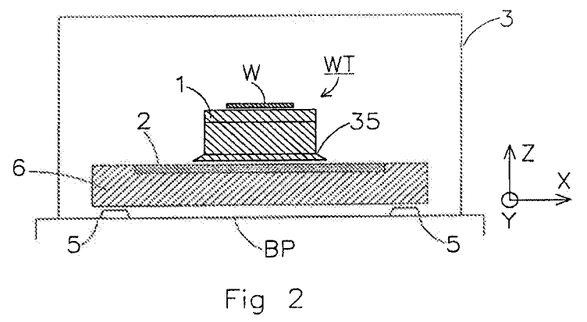
FIG. 2 discloses a positioning system including a table which is moveable with a planar motor wherein the balance mass and the table have a center of mass on a different position.

FIG. 2 discloses a positioning system PW to position a table WT, which may be moveable with a planar motor within, for example in a vacuum chamber 3. The planar motor includes stator 2 and translator 35 to position the table WT in at least the X, Y and Rz direction and if required also in Z, Rx and Ry. Reaction forces of the coarse positioning mechanism (i.e., the planar motor) in the X, Y and Rz direction are transmitted to a balance mass 6 (e.g., a first balance mass). The balance mass 6 is moveable over bearings 5, which allow for movement of the balance mass 6 in the X, Y and Rz direction with respect to the base plate BP, and does not allow movements, i.e., is stiffly coupled, in the Z, Rx and Ry directions with respect to the base plate BP. Reaction forces in all degrees of freedom of the fine positioning mechanism 1 are exerted on the translator 35 and transferred to the balance mass 6. The center of mass of the balance mass 6 and the center of mass of the object table WT are at different positions in the Z-direction, the Z-direction being perpendicular to the X and Y directions. A consequence of the difference in center of mass is that when the planar motor exerts a horizontal force in the X and/or Y direction to the object table WT a torque around respectively the Y and/or X axes is generated in the balance mass 6. Because the balance mass 6 is stiffly coupled to the base plate BP in the Rx and Ry directions by means of the bearings 5, this torque is transferred to the base plate BP.

Figure 3:
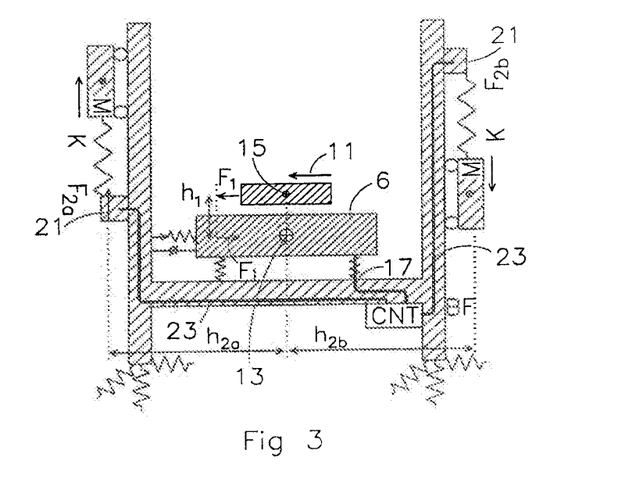
FIG. 3 discloses a positioning system according to an embodiment of the invention.

FIG. 3 discloses a positioning system PW, according to an embodiment of the present invention. The positioning system PW is configured to position a substrate support (e.g., wafer table) WT, alternatively the positioning system PW could also be a used to move a patterning device support (e.g., mask table) MT. The substrate support WT is moved by a planar motor that has a magnet plate that is provided to a balance mass 6 and a coil system that is provided to the substrate support WT. The planar motor exerts a force F1 on the substrate support WT, which makes the substrate support WT move in the direction 11 this force also creates a reaction force F1 on the balance mass 6.

Since the balance mass 6 has a center of mass 13 which is at a distance h1 below the center of mass 15 of the wafer table WT, the force F1 creates a torque on the base frame BF having a force F2 at a distance h2 from the center of mass of the base frame BF of magnitude F1*h1. To compensate this torque, a controller CNT is provided that is connected via connection 17 to the planar motor so that it is provided with a signal representing the quantity, direction and position of the force F1 created by the planar motor.

In one example, the controller includes an input for the quantity of actuation force exerted by the first actuator and a calculator constructed and arranged to calculate a compensation force on the basis of the actuation force. The compensation force calculated by the calculator and generated by the second actuator generates a torque that compensates a torque caused by the difference in position of the center of mass of the first balance mass and the substrate support WT. The term "compensation force" used herein may encompass the force that is actually generated by the actuator, as well as the torque that results from the application of the force.

In one example, the controller CNT calculates forces F2a and F2b that, via electrical connection 23, can be exerted by the second actuators 21 on the balance masses M to compensate for the torque in such a manner that the resulting exerted torque on the base frame BF has an equal magnitude, but an opposite sign, to the disturbance torque with magnitude h1*F1. To ensure that no net force is exerted in addition to the compensation torque, F2a must be equal to F2b. The controller CNT calculates the compensation force on the basis of the direction and the position in which the second actuator can exert the compensation force so that the torque is compensated. The second actuator 21 moves the second balance mass in the first embodiment of the invention in a linear direction.

In one example, FIG. 3 discloses a positioning system in which torques are compensated, which are caused by accelerations of the substrate support WT in the direction 11. Since a planar motor may be used for movements in two directions, the positioning system may also be constructed and arranged for compensation of the torques in two directions. A second actuator and a second balance mass, in addition to the two depicted, may be constructed and arranged to compensate for torques caused by accelerations of the substrate support WT in a direction substantially perpendicular to the direction depicted by 11. The positioning system may than be provided with three or four second actuators and balance masses. By moving the second balance masses simultaneously in one direction the positioning system may also compensate for forces in the direction of gravity.

Figure 4:
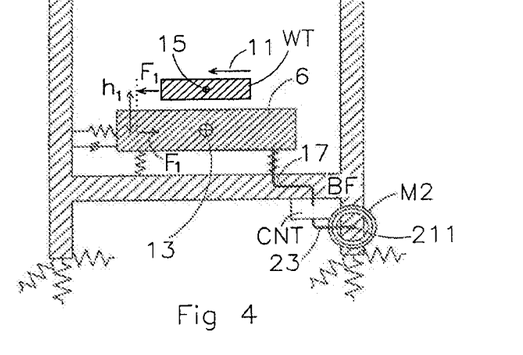
FIG. 4 discloses a positioning system according to an embodiment of the invention.

FIG. 4 discloses a positioning system according to an embodiment of the invention. This embodiment is similar to the embodiment of FIG. 3 for the same reference numbers. According to the embodiment of the invention shown in FIG. 4, a controller CNT is connected to the second actuator 211, which drives a second balance mass M2 in a rotational direction. The actuator rotates the second balance mass M2 so as to create a torque to compensate for the torque of the base frame BF caused by the forces F1 exerted by the planar motor on the wafer table WT and the balance mass 6.

Figure 5:
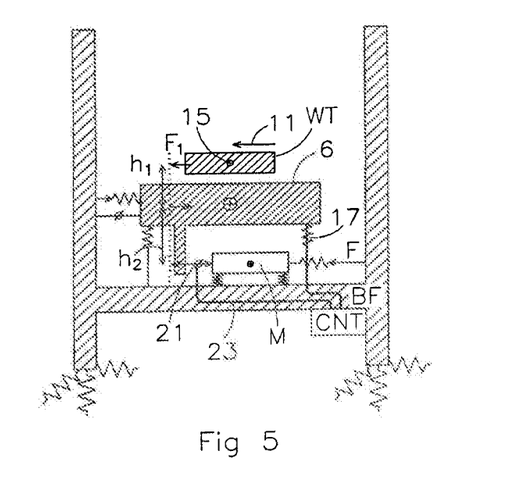
FIG. 5 discloses a positioning system according to an embodiment of the invention.

FIG. 5 discloses a positioning system according to an embodiment of the invention. The embodiment of FIG. 5 is similar to the embodiment of FIG. 3 for the same reference numbers. According to the embodiment of the invention shown in FIG. 5, a second actuator 21 exerts a compensation force in between the balance mass 6 and the second balance mass M. The compensation force exerted by the second actuator 21 can be calculated by the controller CNT. The compensation force equals F1*h1/h2, wherein F1 is the actuation force, h1 is the distance between the centre of mass of the substrate support and the centre of mass of the balance mass 6 and h2 is the distance between the centre of mass of the balance mass 6 and the centre of mass of the second balance mass M.

Figure 6:
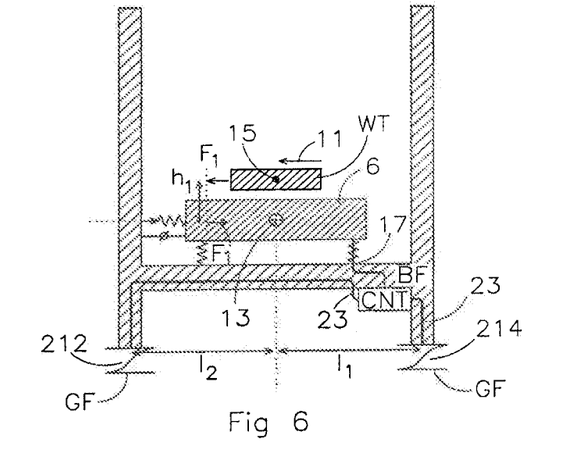
FIG. 6 discloses a positioning system according to an embodiment of the invention.

FIG. 6 discloses a positioning system according to an embodiment of the invention. This embodiment is similar to the embodiment shown in FIG. 3 for the same reference numbers. In the embodiment according to the invention shown in FIG. 6, a torque resulting from the position mismatch of the center of gravity of the substrate support WT with respect to the balance mass 6 is compensated with second actuators 212, 214 exerting the compensation force between the ground floor GF and the base frame BF. The compensation force can be calculated by the formula:

$$h1*F1 = l_1*F214 - l_2*F212$$

Wherein $l_1$, $l_2$ are the distances between the center of mass of the balance mass 6 and the second actuators 214, 212 respectively. Forces F214 and F212 are the compensation forces exerted by the second actuators 214, 212. To keep the base frame stable at its position the sum of compensation forces F214 and F212 should be zero. The ground floor GF may have a limited stiffness and therefore the compensation force may be generated by having a piezo actuator extending its length whereby the ground stiffness should be taken into account.

Figure 7:
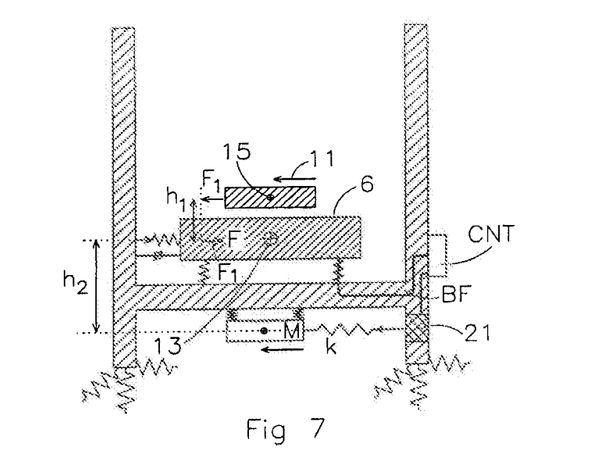
FIG. 7 discloses a positioning system according to an embodiment of the invention.

FIG. 7 discloses a positioning system according to an embodiment of the invention. This embodiment is similar to the embodiment of FIG. 3 for the same reference numbers. According to the embodiment shown in FIG. 7, the second balance mass M is suspended from the base frame BF and a second actuator 21 can exert a compensation force on the second balance mass M to compensate for the torque. The compensation force can be calculated by the controller CNT on the basis of the distance between the centre of gravities $h_1$ and $h_2$ and the actuation force F1.

Additionally, or alternatively, according to an embodiment of the invention, a torque generated by the substrate support WT and its balance mass 6 can be compensated for by a counteracting torque generated by the patterning device support MT and its balance mass. This compensation can be achieved by placing the balance mass of the patterning device support MT somewhat above or below the support MT itself, depending on the movement direction of the patterning device support MT with respect to the substrate support WT.

Combinations and/or variations on the above described modes of use or entirely different modes of use may also be employed. For example, it is possible to combine the torque compensation system of FIGS. 3, 4, 5, 6 and 7.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for positioning at least one of a first support configured to support a patterning device and a second support configured to hold a substrate in a lithographic apparatus, the patterning device being capable of imparting a radiation beam with a pattern in its cross-section to form a patterned beam on the substrate, the method comprising:

exerting an actuation force, using a first actuator, on the at least one of first and second supports;

absorbing a reaction force resulting from the actuation force with a balance mass; and exerting a compensation force, using a second actuator, to compensate a torque caused by the actuation force on the balance mass.

2. The method according to claim 1, wherein the torque is caused by a difference in position of a center of mass of the balance mass and the at least one of first and second supports on which the actuation force is being exerted.

3. The method according to claim 2, wherein the center of mass of the balance mass and the at least one of first and second supports on which the actuation force is being exerted have a difference in position in a first direction; and the actuation force is exerted in a direction perpendicular to the first direction.

4. The method according to claim 3, wherein the first direction is substantially parallel to a vertical plane or gravity and the direction perpendicular to the first direction is substantially in a horizontal plane.

5. The method according to claim 1, wherein exerting an actuation force on the at least one of first and second supports includes:
exerting the actuation force with a planar motor that includes a magnet plate and a coil.

6. The method according to claim 5, wherein the magnet plate is coupled to the balance mass and the coil is coupled to the at least one of first and second supports on which the actuation force is being exerted.

7. The method according to claim 1, further comprising:
providing a base frame configured to moveably support a table, the balance mass, and the first actuator that is configured to exert the actuation force.

8. The method according to claim 1, wherein exerting a compensation force includes:
exerting the compensation force on another balance mass.

9. The method according to claim 8, wherein the second actuator is configured to exert the compensation force between a base frame and a surface that supports the base frame, wherein the base frame is configured to moveably support the balance mass and the first actuator that is configured to exert the actuation force.

10. The method according to claim 8, further comprising:
actuating the another balance mass in a rotational direction by the second actuator to exert the compensation force.

11. The method according to claim 8, wherein the another balance mass is moveably suspended from a base frame; and the second actuator is configured to exert the compensation force between the another balance mass and the base frame.

12. The method according to claim 8, wherein the another balance mass is moveably suspended from the balance mass.

13. The method according to claim 1, further comprising:
receiving a signal representative of the actuation force; and calculating the compensation force based on the actuation force.

14. The method according to claim 1, further comprising:
calculating the compensation force based on a position and direction of the actuation force and a position and direction of the compensation force.

15. A method for positioning a support in a lithographic apparatus, the method comprising:
exerting a first force, using a first actuator, between a balance mass and the support, the first force moving the support relative to the balance mass; and
controllably exerting a second force, using a second actuator, to compensate a torque caused by a difference in position of a center of mass of the balance mass and the support.

16. The method according to claim 15, wherein the second force is exerted on an another balance mass.

* * * * *